US012701661B2

(12) United States Patent
Baftiri et al.

(10) Patent No.: US 12,701,661 B2
(45) Date of Patent: Aug. 4, 2026

(54) COMPONENT CARRIER WITH CONNECTED COMPONENT HAVING REDISTRIBUTION LAYER AT MAIN SURFACE

(71) Applicant: AT&S Austria Technologie & Systemtechnik AG, Leoben (AT)

(72) Inventors: Artan Baftiri, Chongqing (CN); Jeesoo Mok, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 636 days.

(21) Appl. No.: 18/156,373

(22) Filed: Jan. 18, 2023

(65) Prior Publication Data

US 2023/0232535 A1 Jul. 20, 2023

(30) Foreign Application Priority Data

Jan. 19, 2022 (CN) .......................... 202210062362.8

(51) Int. Cl.
| | |
|---|---|
| *H05K 1/181* | (2026.01) |
| *H05K 1/185* | (2026.01) |
| *H05K 3/303* | (2026.01) |

(52) U.S. Cl.
CPC ............. *H05K 1/181* (2013.01); *H05K 1/185* (2013.01); *H05K 3/303* (2013.01)

(58) Field of Classification Search
CPC ........ H05K 1/181; H05K 1/183; H05K 1/185; H05K 3/30; H01L 25/0652
See application file for complete search history.

(56) References Cited

U.S. PATENT DOCUMENTS

| | | | |
|---|---|---|---|
| 6,348,728 B1 * | 2/2002 | Aiba ....................... | H01L 24/94 |
| | | | 257/E25.011 |
| 2009/0085823 A1 | 4/2009 | Mason et al. | |
| 2010/0328914 A1 | 12/2010 | Droz | |
| 2013/0161782 A1 | 6/2013 | Rajendran et al. | |
| 2016/0295700 A1 | 10/2016 | Yu et al. | |
| 2016/0322315 A1 | 11/2016 | Kertesz | |
| 2020/0083173 A1 * | 3/2020 | Weidinger .............. | H01L 24/96 |
| 2020/0100365 A1 | 3/2020 | Titjung et al. | |
| 2020/0135651 A1 | 4/2020 | Chiu et al. | |

(Continued)

FOREIGN PATENT DOCUMENTS

| | | |
|---|---|---|
| CN | 101211903 A | 7/2008 |
| CN | 112492741 A | 3/2021 |

(Continued)

OTHER PUBLICATIONS

Deconink, E.; Extended European Search Report in Application 23152230.1; pp. 1-6; Sep. 18, 2023, European Patent Office, 80298, Munich, Germany.

(Continued)

*Primary Examiner* — Nathan Milakovich

(74) *Attorney, Agent, or Firm* — Robert A. Blaha; Smith Tempel Blaha LLC

(57) ABSTRACT

A component carrier includes a stack including at least one electrically conductive layer structure and at least one electrically insulating layer structure and a component connected to the stack. The component has a planar redistribution layer at a main surface thereof.

19 Claims, 6 Drawing Sheets

(56)                References Cited

U.S. PATENT DOCUMENTS

| 2021/0227702 A1    | 7/2021  | Tuominen et al. |
| 2023/0300982 A1 *  | 9/2023  | Leitgeb .................. H05K 1/113 |
|                    |         | 174/260 |
| 2025/0349556 A1 *  | 11/2025 | Mok ..................... H10W 70/05 |

FOREIGN PATENT DOCUMENTS

| JP | H05291347 A  | 11/1993 |
| KR | 20040047902 A | 6/2004 |
| TW | 201830609     | 8/2018 |
| TW | 201830609 A   | 8/2018 |

OTHER PUBLICATIONS

Office Action in Application No. 202210062362.8; pp. 1-6; Apr. 24, 2026; China National Intellectual Property Administration, No. 6 Xitucheng Road, Haidian District, Beijing, P.R. China, 100088.

English Translation of Office Action in Application No. 202210062362. 8; pp. 1-8; Apr. 24, 2026; China National Intellectual Property Administration, No. 6 Xitucheng Road, Haidian District, Beijing, P.R.China, 100088.

Communication Pursuant to Article 94(3) in Application No. 23 152 230.1; pp. 1-9; Jun. 29, 2026; European Patent Office, 80298, Munich, Germany.

* cited by examiner

COMPONENT CARRIER WITH CONNECTED COMPONENT HAVING REDISTRIBUTION LAYER AT MAIN SURFACE

CROSS-REFERENCE TO RELATED APPLICATIONS

This application claims the benefit of the filing date of Chinese Patent Application No. 202210062362.8 filed Jan. 19, 2022, the disclosure of which is hereby incorporated herein by reference.

TECHNICAL FIELD

Embodiments disclosed herein relate to a component carrier and a method of manufacturing a component carrier.

BACKGROUND ART

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

For embedding a component in a layer stack, a through hole can be formed in the layer stack and can be closed from a bottom side by a temporary carrier such as an adhesive tape. A dielectric layer may be laminated on top of the stack and the component. Thereafter, the temporary carrier is released. Also, copper foils may be laminated and/or copper filled laser vias may be formed. Electrically connecting an embedded component is however still a challenge.

In a corresponding way, electrically connecting a surface-mounted component may also involve effort.

SUMMARY

There may be a need for a compact component carrier with connected component being manufacturable simply and with high reliability.

According to an exemplary embodiment of the invention, a component carrier is provided, wherein the component carrier comprises a stack comprising at least one electrically conductive layer structure and at least one electrically insulating layer structure, and a component connected to the stack, wherein the component has a planar redistribution layer at a main surface thereof.

According to another exemplary embodiment of the invention, a method of manufacturing a component carrier is provided, wherein the method comprises providing a stack comprising at least one electrically conductive layer structure and at least one electrically insulating layer structure, connecting a component to the stack, and providing the component with a planar redistribution layer at a main surface thereof.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated stack, such as a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote a flat or planar sheet-like body. For instance, the stack may be a layer stack, in particular a laminated layer stack or a laminate. Such a laminate may be formed by connecting a plurality of layer structures by the application of mechanical pressure and/or heat.

In the context of the present application, the term "layer structure" may particularly denote a continuous layer, a patterned layer or a plurality of non-consecutive islands within a common plane.

In the context of the present application, the term "component" may particularly denote an inlay, for instance fulfilling an electronic and/or a thermal task. For instance, the component may be an electronic component. Such an electronic component may be an active component such as a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die.

In the context of the present application, the term "main surface of component" may particularly denote one or more largest planar surface area(s) of the component. Usually, a substantially cuboid component may have two opposing main surfaces in the form of two horizontal surface areas on top and on bottom of the component. Thus, the main surface may be different from the sidewalls of the component. Hence, the component may preferably comprise two main surfaces parallel and opposite to each other, preferably spaced with respect to each other by the component thickness. In an embodiment, the component only has one side (which may be denoted as front side) with electrical connections, so that the redistribution layer will then be present only on the front side of the component.

In the context of the present application, the term "redistribution layer" may particularly denote a patterned electrically conductive layer which has a portion with a lower pitch as compared to another portion with a higher pitch. Pitch may denote a characteristic distance between adjacent electrically conductive structures, such as wiring elements or terminals. In particular, pitch may denote the distance between electrically conductive structures (such as leads) of a semiconductor chip. By providing spatially separate regions with different pitch, a redistribution layer may be an electric interface between larger dimensioned electric connection structures (in particular relating to component carrier technology, more particularly printed circuit board technology or integrated circuit substrate technology) and smaller dimensioned electric connection structures (in particular relating to semi-conductor chip technology, wherein the embedded component may be a semiconductor chip). In particular, a number of electrically conductive structures per area may be larger in a region with larger pitch than in another region with smaller pitch. A region with larger pitch may be arranged in a center of the main surface of the component, whereas another region with smaller pitch may be arranged at a periphery, a perimeter or an outer region of the main surface of the component. In particular, "redistribution" may mean a provision of an electrical connection between a plurality of contacts (preferably contacts provided in an internal area of the stacked layer and/or the component surface) and further displaced contacts (preferably provided on the external profile of a stack layer and/or the component surface). A "redistribution layer" may mean a common layer where said connection is provided. A task of a redistribution layer may be to rearrange the circuity of the component to get the signal out from the different portions with different functions inside of the component. Said signals may be transmitted to or interconnected with the stack of the component carrier at same level due to the structure and function inside of the component. It is also possible that sections of an overall redistribution layer are provided by both the component and the component carrier's stack depending on the design and purpose. A function of the redistribution layer may be to rear-range the circuity and realize interconnection of two different densities of electric connection structures.

In the context of the present application, the term "planar redistribution layer" may particularly denote a redistribution layer extending completely within a plane, in particular in a horizontal plane.

In the context of the present application, the term "the component has a planar redistribution layer at a main surface thereof" may particularly denote that the redistribution layer is a physical structure integrally connected with and therefore belonging to the component, rather than to the stack.

According to exemplary embodiment of the invention, a component carrier with connected (in particular active electronic) component(s) is provided, wherein at least one main surface of the connected component is provided with a redistribution layer which contributes to a transition of electric connection structures from smaller characteristic dimensions and distances at the component side to larger characteristic dimensions and distances at the side of the stack of the component carrier. By providing a planar redistribution layer integrally connected at a main surface of a connected component, the component itself may contribute to rendering electric connection dimensions of the PCB world and of the semiconductor world compatible. The paradigm shift of exemplary embodiments of the invention to configure a main surface of a connected component, rather than exclusively stack material of a component carrier, with a planar redistribution layer may lead advantageously to a more compact component carrier with connected component. Furthermore, the mentioned concept of exemplary embodiments of the invention may significantly simplify a method of manufacturing a component carrier with connected component, since electrically contacting the component can be executed in an easy and reliable way. Moreover, providing a main surface of a (preferably semiconductor chip-type) component with a planar redistribution layer can be achieved essentially without additional manufacturing effort, since (in particular semiconductor chip-type) components may comprise anyway electric structures on the main surface, such as pads. A common electrically conductive layer on a main surface of a component can thus be used for simultaneously forming pads and a redistribution layer by merely adjusting a patterning process in a simple way. Thus, provision of the component with a component-sided planar redistribution layer can already be done during a semiconductor manufacturing stage prior to component carrier manufacturing processes in terms of connecting.

In the following, further exemplary embodiments of the manufacturing method, and the component carrier will be explained.

In a preferred embodiment, the component is embedded in the stack. In the context of the present application, the term "embedded component" may particularly denote a component being arranged partially or entirely inside the stack. This may be accomplished by fully circumferentially sur-rounding the component with stack material. However, this may also be done by inserting the component in a recess or cavity of the stack while an upper main surface and/or side wall portions of the component may extend partly or entirely out of the stack. Providing an embedded component with redistribution layer at a main surface thereof may be of particular advantage, since this may significantly reduce the thickness of the obtained component carrier and may simplify construction of the stack. Hence, it may be advantageously possible to design a redistribution layer on the component and connect the component on the same level with the component carrier's stack through the interconnection between an edge trace and a pad of the component. Advantageously, this may reduce the layer count of the component carrier.

In another embodiment, the component is surface mounted on the stack. Already on the level of its main surface, the surface-mounted component may be provided with a redistribution layer which may simplify construction of the stack and which may keep the height of the component carrier with the surface-mounted component small.

Generally, the component may be provided on or at the stack in any desired way. Hence, embodiments relate to a component on or at the component carrier with the component redistribution layer overlapping contacts provided on said carrier surface. In another preferred embodiment, the component with the component redistribution layer is embedded in the stack.

In an embodiment, the planar redistribution layer at the main surface of the component could be only one single patterned electrically conductive layer. By using exactly one electrically conductive layer for creating the entire planar redistribution layer, a high compactness in vertical direction may be combined with a simple manufacturability.

However, in particular for high-density applications, the planar redistribution layer at the main surface of the component may be formed by a plurality of patterned electrically conductive layers. For instance, for high performance computing applications, a layer count of more than one may be advantageous for the redistribution layer.

In an embodiment, the planar redistribution layer extends within a single horizontal plane. When the planar redistribution layer is formed on a horizontal surface area of the embedded component, its connection to horizontally extending electrically conductive layer structures of the stack may be simplified.

In an embodiment, the stack comprises a further planar redistribution layer. When also the stack comprises a further planar redistribution layer, the planar redistribution layers of the stack and the component may functionally cooperate for providing an overall refined redistribution function.

In an embodiment, the further redistribution layer extends within a horizontal plane. This allows a connection of the redistribution layer of the component when extending in a horizontal plane with the further redistribution structure of the stack extending in a horizontal plane as well (which may be the same horizontal plane) in a simple manner.

In an embodiment, the redistribution layer and the further redistribution layer are electrically coupled with each other.

Thus, electric current may flow between the redistribution layer and the further redistribution layer so that the embedded component may be electrically addressable even from outside of the component carrier.

In an embodiment, a (preferably planar horizontal) main surface of the redistribution layer is directly connected with a (preferably planar horizontal) main surface of the further redistribution layer at a common horizontal plane. For example, a lower surface of the further redistribution layer may be directly connected with an upper surface of the redistribution layer, or vice versa. In other words, the lower surface of the further planar redistribution layer may be co-planar with, i.e., may be arranged in the same horizontal plane as, the upper surface of the redistribution layer. Such an embodiment is shown, for example, in FIG. 2. In other words, the distribution layer and the further redistribution layer may extend in the same horizontal plane which creates a common purely horizontal electric interconnection structure. This keeps signal paths short and thereby contributes to a compact configuration, a high signal quality and low losses. A person skilled in the art will understand that the redistribution layer and the further redistribution layer can be considered as coplanar when these two redistribution layers are connected on more or less the same vertical level, even there might be a gap of not more than 3 μm or even of not more than 5 μm (which may be due to an opening of the component). However, after pattern plating, the component may be for example connected directly on the same level. In the described situation of the present embodiment, the redistribution layer and the further redistribution layer can be considered coplanar as well.

In an embodiment, the component carrier comprises a flat connection pad between the redistribution layer and the further redistribution layer. Such an embodiment is shown, for example, in FIG. 3. Such a flat connection pad, which may have a small thickness, may establish a short electric connection between redistribution layer and further redistribution layer when formed in essentially but not exactly identical horizontal planes. Descriptively speaking, such a flat connection pad may bridge a very small vertical spacing between redistribution layer and further redistribution layer in a simple way.

Moreover, the aforementioned connection pad may comprise material merging from the redistribution layer and/or the further redistribution layer. Said material merging from the redistribution layer may contact the lateral profile of the further redistribution layer, or vice versa. It is also possible that the material merging from the redistribution layer is embedded in the material merging from the further redistribution layer, or vice versa. In an embodiment, the material merging from the redistribution layer may extend from the plane of the redistribution layer toward or to the plane of the further redistribution layer, or vice versa.

In another embodiment, the redistribution layer and the further redistribution layer are directly connected with each other. More specifically, a bottom surface of one of said redistribution layers may be directly connected with a top surface of the other one of said redistribution layers. For instance, the mentioned redistribution layers may be connected even without a connection pad in between, for instance by thermocompression bonding, soldering, wiring, or sintering. This may keep signal paths extremely short and may therefore guarantee a high signal transmission quality.

In an embodiment, the further redistribution layer of the stack has a smaller integration density than the redistribution layer of the component. The term "integration density" may denote a number of electrically conductive structures per area of the respective redistribution layer. Hence, the amount of contacts (including pads) per area on the redistribution layer may be higher than the amount of the contacts (including pads) per area on the further redistribution layer. Thus, integration density may mean a quantity of traces per mm². The integration density in the further redistribution layer can be less than in the redistribution layer, and correspondingly the line space ratio may be different (for instance 9 μm/12 μm in the further redistribution layer compared with 2 μm/2 μm in the redistribution layer). Since PCB or IC substrate technology (according to which the stack may be formed) may be based on larger electrically conductive structures than semiconductor technology (according to which the component may be formed), the mentioned design rule may be appropriate for bridging the two combined technologies.

In an embodiment, the further redistribution layer has a larger line space ratio (L/S) than the redistribution layer. The term "line space ratio" may denote a pair of characteristic dimensions of an electrically conductive wiring structure, i.e., a characteristic line width of one electrically conductive wiring structure and a characteristic distance between adjacent electrically conductive wiring structures. For instance, the line space ratio (L/S) of the redistribution layer of the component may be not more than 4 μm/4 μm, in particular not more than 2 μm/2 μm. For example, the line space ratio (L/S) of the further redistribution layer of the stack may be more than 5 μm/5 μm, in particular more than 8 μm/8 μm.

In an embodiment, the redistribution layer comprises a plurality of electrically conductive traces extending in and along the main surface of the component. An electric signal may be conducted along such a trace. The trace may be curved in a two-dimensional space relating to the main surface of the component, so that already on the level of the component, a pitch adaptation can be performed, partially or entirely.

In an embodiment, the traces comprise a parallel section along which the traces extend parallel to each other and comprise a diverging section at which the traces diverge from each other (i.e., are split). In a region of the main surface of the component with higher integration density, traces may extend parallel to each other on the main surface of the embedded component for transmitting electric signals between component and stack. In a connected diverging section of the main surface of the component with lower integration density, the traces may be guided so that a mutual distance in between adjacent traces is increased.

In an embodiment, the traces extend in an area region of the main surface between pads at the main surface of the component. By using the space between different pads of the semiconductor chip-type component for guiding traces of the horizontal redistribution layer of the component, the available space on the main surface may be used highly efficiently. Consequently, even complex wiring structures may be realized on a main surface of an embedded component.

In an embodiment, the component carrier comprises a further embedded component arranged laterally with respect to the component, preferably at the same vertical level. All disclosure herein concerning the embedded component can be applied also, mutatis mutandis, to the at least one further embedded component. For instance, it is possible to embed one or more (preferably semiconductor chip-type) components side-by-side in the stack. Arranging them at the same vertical level may be achieved by assembling the components in a common cavity formed in the stack. Advantageously, said laterally arranged components may be functionally (and preferably electrically) coupled so as to provide a combined functionality. For example, one component may be a processor chip and the further component may be a memory chip or a sensor chip interconnected with the processor chip.

In an embodiment, the further component has another planar redistribution layer at a main surface thereof. All disclosure herein concerning the planar redistribution layer of the component can be applied also, mutatis mutandis, to the planar redistribution layer of the further component.

In an embodiment, the component and the further component are electrically coupled with each other along a horizontal connection line. The horizontal connection line may be formed at the same vertical level as the further redistribution layer. Preferably, the component and the further component may be electrically coupled with each other via the planar redistribution layer and the other planar redistribution layer and at least one horizontal connection line preferably extending horizontally as well. This may lead to a highly compact component carrier with short electric connection paths and consequently a high signal quality. The horizontal connection line may form part of the electrically conductive layer structures of the stack.

In another embodiment, the component and the further component are electrically coupled with each other by a bridge die arranged between the component and the further component. Such a bridge die may be yet another embedded component being arranged in a region between component and other component, preferably at the same vertical level as component and other component. Such a bridge die may include interior circuitry coupled with the redistribution layers of component and further component for appropriately coupling electric signals between the components. Such an approach may also support complex electrically conductive wiring schemes. A connection between component and bridge die as well as a connection between bridge die and further component may be accomplished by a respective horizontal connection line (in particular embodied as described above).

Referring to the two previously described embodiments, one more option is that the further redistribution layer of the stack of the component carrier (instead of the bridge die or the horizontal connection line) is used to connect the two components, for instance in a fan out fashion.

In an embodiment, the redistribution layer provides electric connections in two orthogonal directions, in particular provides electric connections at all four sides of the component (see for example FIG. 17). Within a horizontal plane in which the planar redistribution layer of the component extends, wiring structures may provide connections in a first direction, in a second direction perpendicular to the first direction, in slanted directions extending between the first direction and the second direction and/or comprising sections relating to the first direction, to the second direction and/or relating to said slanted directions.

In an embodiment, the redistribution layer and the further redistribution layer are electrically coupled with each other in the two orthogonal directions, in particular provide electric connections at said all four sides of the component. A four-sided connection of an embedded component may allow to realize even complex wiring structures with multipad components. Corresponding to the above-described configuration of the redistribution layer, the further redistribution layer of the stack may surround the main surface of the component at all four sides and may provide a wiring structure being connected with wiring structures of the redistribution layer of the component at all four sides.

In the following, different embedding technologies which may be used according to exemplary embodiments for embedding the component in the stack will be explained:

In an embodiment, the method of manufacturing the component carrier comprises embedding the component in an opening of the stack, wherein the opening is at least temporarily closed at a bottom side by a sticky layer during the embedding. In the context of the present application, the term "sticky layer" may particularly denote a tape, film, foil, sheet, or plate having an adhesive surface. In use, the sticky layer may be used to be adhered to a main surface of a stack for closing an opening extending through the stack. The component to the embedded may be adhered to the sticky layer for defining a position of the component in the opening and thus relative to the stack. When the sticky layer is removed from the stack before completing manufacture of the component carrier, the sticky layer may be denoted as a temporary carrier. In other embodiments, the sticky layer may however form part of the readily manufactured component carrier. By adhering the component on the sticky tape during the embedding process, the spatial accuracy of the embedding of the component may be significantly improved.

In another embodiment, the method comprises mounting the component on at least one of the layer structures or on a temporary carrier, and thereafter covering the component with layer structures or with further ones of the layer structures, wherein at least one of said layer structures is provided with an opening accommodating the component. For example, the opening of the respective layer structure may be cut as a through hole into the respective layer structure. Further alternatively, it is also possible to cover the component, attached to a temporary carrier or to one or more layer structures, with a flowable medium, such as resin.

In yet another embodiment, the method comprises embedding a release layer in the stack, thereafter, forming an opening in the stack by removing a piece of the stack which is delimited at a bottom side by the release layer, and thereafter accommodating the component in the opening. For instance, such a release layer may be made of a material showing poorly adhesive properties with respect to surrounding stack material. For instance, an appropriate material for the release layer is polytetrafluoroethylene (PTFE, Teflon®), or a waxy compound. Teflon is a registered mark of The Chemours Company FC, LLC of Wilmington, Delaware, U.S.A. The method may comprise forming a circumferential cutting trench in the stack extending up to the release layer to thereby separate the piece from a rest of the stack. Cutting said trench may be accomplished for example by laser drilling or mechanically drilling.

In another embodiment, the method comprises forming an opening in the stack by routing (preferably depth routing), and thereafter accommodating the component on a bottom surface of the routed stack in the opening. Routing is an appropriate and simple mechanism of precisely defining a blind hole-type opening for subsequently accommodating the component.

In an embodiment, the stack comprises at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high-frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten, titanium and magnesium. Although copper is usually preferred, other materials or coated versions thereof are possible as well, in particular metals or materials coated with supra-conductive material or conductive polymers, such as graphene or poly(3,4-ethylenedioxythiophene) (PEDOT), respectively.

At least one further component may be embedded in and/or surface mounted on the stack. The component and/or the at least one further component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O3$) or aluminum nitride (AlN). In order to increase the heat ex-change capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semi-conductor materials such as silicon carbide (SiC), gallium arsenide (GaAs), gallium nitride (GaN), gallium oxide ($Ga_2O_3$), indium phosphide (InP), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer, or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
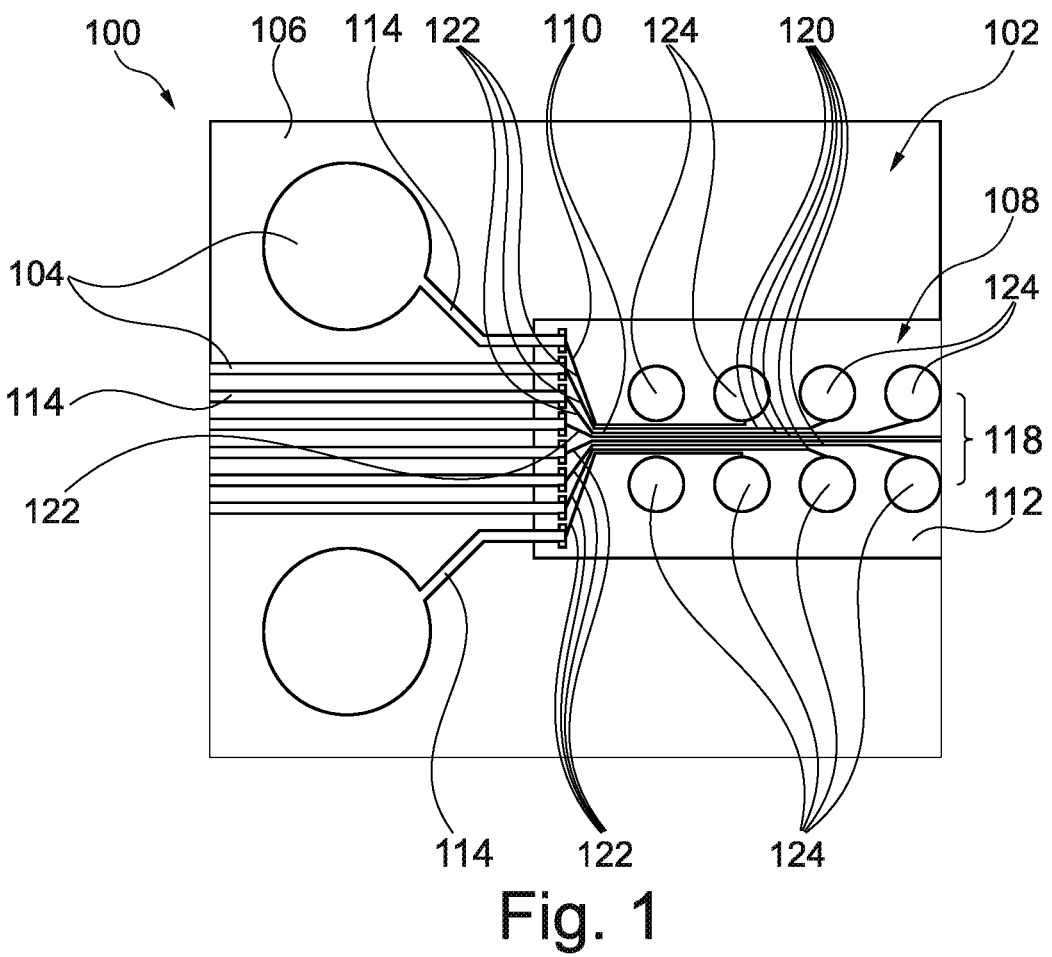
FIG. 1 illustrates a plan view of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier (such as a printed circuit board, PCB, or an integrated circuit (IC) substrate) has a component (for example a semiconductor chip with pads at one or both of its main surfaces) integrated in a laminated layer stack. Advantageously, the component may have a planar redistribution layer at one or both of its opposing main surfaces. Thus, a connection surface of a semiconductor chip-type component may be equipped additionally with a planar redistribution layer extending preferably in the horizontal plane so as to be properly prepared for connecting it to one or more electrically conductive layer structures of the stack in a simple way. Resulting electric connection paths are short so that signal distortion may be strongly suppressed while allowing to manufacture the component carrier with miniature dimensions (in particular what concerns thickness in a vertical direction). As a result, an integrated circuit of the embedded component may be directly contacted to achieve interconnection densification. Advantageously, a redistribution layer on a main surface of an embedded electronic component may be equipped with an application-specific wiring structure in a simple way, since this may be done by merely patterning a layer on the main surface of the component. Patterning an electric layer on a main surface of a chip-type component may be done anyway for equipping the main surface with one or more pads. Simultaneously, such as patterned electrically conductive layer on a main surface of the component may form wiring structures in addition to the one or more pads for creating the planar redistribution layer.

According to an exemplary embodiment, a die redistribution layer (RDL) may be formed as part of the embedded component for surface interconnection purposes. On the PCB or other kind of component carrier, in which a die-type component is embedded, an electrically insulating layer structure (such as a resin (like epoxy resin), optionally comprising reinforcing particles (such as glass fibers)) may remain non-patterned or continuous prior to embedding the component in the stack. Later in the processing (for example after removal of a sticky tape or another temporary carrier), material of said electrically insulating layer of the stack may be removed by patterning. Thereafter, edge traces may be used for connection, instead of round pads. It may for instance also be possible to directly plate on edge traces. The described manufacturing architecture may allow signal routing on the die-type component with high yield and fine line space L/S on the component (for example 2 μm/2 μm or below). A line space ratio L/S of the manufactured electrically conductive layer structures of the stack may have a line space ratio of for instance 9 μm/12 μm or below, but usually larger than the line space ratio of the redistribution layer on the main surface of the embedded component.

What concerns the creation of the planar redistribution layer on a main surface of the component, the die-type component may be specifically designed on this main surface to be functionalized for connection with the stack, preferably before embedding. The obtained fine line space redistribution layer may lead to a high yield of the manufactured component carriers and may be formed by semiconductor manufacturing. There may be a possibility to reduce a layer count due to the possibility to route signals already on the same layer as the die RDL. This may lead to a reduction of the vertical height. Hence, it may be highly advantageous to design a redistribution layer directly on a main surface of and forming part of a component to be embedded in a laminated layer stack. Such a redistribution layer which may extend to the die edge may allow for directly contacting the rest of the component carrier, in particular with at least one electrically conductive layer structure of the stack. Hence, a larger line space ratio on the PCB-stack (for example 9 μm/12 μm) may be easily combined with a finer line space on the die RDL (for instance 2 μm/2 μm). Furthermore, the described manufacturing architecture may allow to obtain a reduction of height of the component carrier while increasing the interconnection density.

A proper alignment between redistribution layers of component and stack to be connected can be ensured for example by adaptive imaging. During manufacture, it may be possible to align the height of the component surface to stack or substrate surface. Pattern plating may be done simultaneously with interconnection connection plating. In addition, it may be possible to use pads to connect next build up layers by a laser process. In different embodiments, the stack-up of the component carrier can be symmetric or asymmetric based on the requirements of the specific application.

A further advantage of exemplary embodiments of the invention is the possibility to route signals already at the same layer level as the planar redistribution layer of the embedded component. This may be achieved directly after a first layer press or embedding process. Advantageously, this may make it possible to combine a larger line space ratio of the laminated stack with a smaller line space ratio on the semiconductor chip forming the embedded component. Connecting a redistribution layer of the component with a further redistribution layer of the stack (for example by a flat connection pad or directly, for example by thermocompression bonding or soldering) may allow to create a trace-to-trace alignment between embedded component and substrate.

Exemplary applications of exemplary embodiments of the invention are packages for modules, and any kind of PCB-products with one or more embedded components. Exemplary embodiments may also produce fan-out component carriers, embedded modules, and low vertical height embedded packages.

Figure 2:
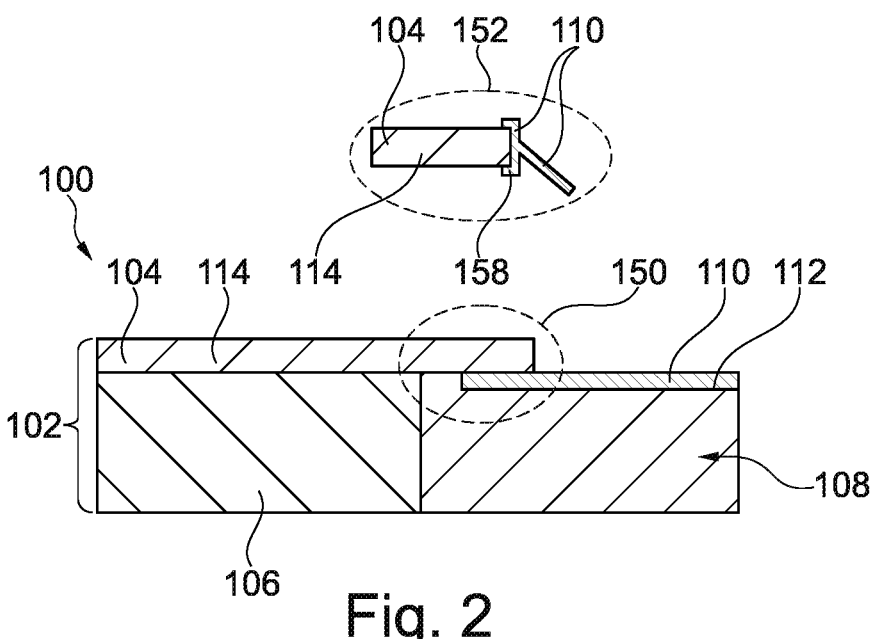
FIG. 2 illustrates a cross-sectional view and a detail of a plan view of the component carrier according to FIG. 1.

FIG. 1 illustrates a plan view of a component carrier 100 according to an exemplary embodiment of the invention. FIG. 2 illustrates a cross-sectional view and a detail 152 of a plan view of the component carrier 100 according to FIG. 1.

The component carrier 100 according to FIG. 1 may be configured as a plate-shaped printed circuit board (PCB). Thus, the component carrier 100 shown in FIG. 1 may be highly compact in a vertical direction. More specifically, the component carrier 100 may comprise a stack 102 comprising one or more electrically conductive layer structures 104 and one or more electrically insulating layer structures 106. Each of the electrically conductive layer structures 104 may comprise one or more patterned metal layers (such as deposited copper layers and/or copper foils) and vertical through connections, for example copper filled vias which may be created by drilling and plating. The electrically insulating layer structure(s) 106 may comprise a respective resin (such as a respective epoxy resin), preferably comprising reinforcing particles therein (for instance glass fibers or glass spheres). For instance, the electrically insulating layer structures 106 may be made of FR4.

Moreover, the component carrier 100 according to FIG. 1 and FIG. 2 comprises a component 108 (such as a semiconductor chip) embedded in the stack 102. As part of the component 108 itself rather than as part of the stack 102, the component 108 has a planar redistribution layer 110 at a main surface 112 thereof. For instance, planar redistribution layer 110 may be formed on the component 108 during a semiconductor chip manufacturing process, i.e., before initiating a component carrier manufacture process. For example, the illustrated planar redistribution layer 110 may be formed by elongate traces 118 of a patterned metal layer, wherein patterning such a metal layer may form simultaneously the planar redistribution layer 110 and, coplanar therewith, round (and/or polygonal, not shown) pads 124. Advantageously, the planar redistribution layer 110 at the main surface 112 of the component 108 is formed by only one patterned electrically conductive layer. This contributes to a simplification of the manufacturing process. In another embodiment, the planar redistribution layer 110 may be formed by a plurality of patterned electrically conductive layers (for instance for high computing applications). The (optional) pads 124 may be connected with integrated circuit elements (such as transistors and/or diodes) which may be monolithically integrated in a semiconductor (for example silicon) body of the component 108.

Again, referring to FIG. 1 and FIG. 2, the planar redistribution layer 110 may extend within a horizontal plane. Thus, the planar redistribution layer 110 of the embedded component 108 does not add a noteworthy contribution to the vertical thickness of the component carrier 100. Only one main surface 112, i.e., the upper main surface, of the embedded component 108 is visible in FIG. 1 and FIG. 2. Additionally or alternatively to the upper main surface, also the other main surface, i.e., the lower main surface (not shown), of the embedded component 108 may be equipped with a planar redistribution layer belonging to the component 108 rather than to the stack 102.

In addition to the one or more planar redistribution layers 110 of the embedded component 108, also the stack 102 may comprises a further planar redistribution layer 114 which extends as well within a horizontal plane. The further planar redistribution layer 114 may be formed during a PCB manufacturing process. For instance, the further planar redistribution layer 114 may be patterned after having inserted the component 108 into a cavity previously formed in the stack 102. As indicated by reference sign 150 in FIG. 2, the redistribution layer 110 and the further redistribution layer 114 are electrically coupled with each other in an outer, peripheral, or edge region of the main surface 112 of the embedded component 108. Advantageously, a main surface of the redistribution layer 110 is directly connected with a main surface of the further redistribution layer 114 at a common horizontal plane. More specifically, a lower surface of the further redistribution layer 104 may be directly connected with an upper surface of the redistribution layer 110. In other words, the lower surface of the further planar redistribution layer 104 may be co-planar with, i.e. may be arranged in the same horizontal plane as, the upper surface of the redistribution layer 110. In the shown embodiment, the further redistribution layer 114 of the stack 102 laterally overlaps with the redistribution layer 110 of the embedded component 108 in the outer, peripheral or edge region for electric connection purposes. Descriptively speaking, the interconnected redistribution layers 110, 114 spatially distribute the function of redistributing electric signals among the embedded component 108 and among the laminated stack 102 in which the component 108 is embedded. In other words, the overall redistribution function in component carrier 100 is provided by the cooperating redistribution layers 110, 114. With the mentioned redistribution function, tiny characteristic electric extensions of semiconductor technology can be matched with larger electric extensions of PCB technology. As shown, electrically conductive traces 120 of the redistribution layer 110 of component 108 have a higher integration density (i.e., more electrically conductive structures per area) compared with a lower integration density in the laminated stack 102. The redistribution layer 110 may be formed on the main surface 112 of component 108, so unused chip area may be functionalized for contributing to the redistribution of electric signals within the component carrier 100 with embedded component 108. This also makes an advantageous contribution to the miniaturization of the component carrier 100, because less area and volume may be sufficient in the stack 102 for ensuring redistribution. As a consequence, the electric propagation paths of electric signals within component carrier 100 may be shortened, which has a positive impact on signal quality and suppresses signal losses.

As can be seen best in FIG. 2, the redistribution layer 110 and the further redistribution layer 114 are coplanar, i.e. may be directly mutually connected with each other and both extend exclusively horizontally. Descriptively speaking, the shown embodiment enables a horizontal fan-out at one vertical level. For example, this may be accomplished by applying material of the further redistribution layer 114 in the overlapping region with the redistribution layer 110 directly thereon, i.e., with direct physical contact. Thus, the redistribution layer 110 and the further redistribution layer 114 may be directly connected with each other, with or without an electrically conductive connection medium (such as solder material, sinter paste, electrically conductive glue, nano copper and other metal bonding material, etc.). A person skilled in the art will understand that such electrically conductive connection medium (if present at all) can be provided with such a small thickness that redistribution layers 110, 114 can still be considered as coplanar.

As already mentioned and as can be taken best from FIG. 1, the further redistribution layer 114 has a smaller integration density of electrically conductive structures than the redistribution layer 110. Correspondingly, the further redistribution layer 114 of stack 102 has a larger line space ratio L/S (for instance at least 5 μm/5 μm) than the redistribution layer 110 of component 108 (for instance 2 μm/2 μm or less). In other words, the redistribution layer 110 comprises a plurality of (in particular linear) trace portions (in particular in form of traces 118), each connecting component contact areas (in particular in form of pads 124) in one extremity, and the further redistribution layer 114 comprises further (in particular linear) trace portions (in particular in form of electrically conductive layer structures 104, see FIG. 1), wherein said further trace portions are electrically connected to an extremity of the trace portions, and wherein distances between said trace portions are smaller than distances between said further traces portions. The term "linear" may cover in particular rectilinear, curved, fuzzy lines, etc.

Still referring to FIG. 1, the redistribution layer 110 comprises a plurality of electrically conductive traces 118 extending in and along the main surface 112 of the component 108. Each of said traces 118 comprises a parallel section 120 (located in a central region of the main surface 112 of the component 108) along which the traces 118 extend parallel to each other and comprises a diverging section 122 (located in a peripheral region of the main surface 112 of the component 108) at which the traces 118 diverge from each other. A respective parallel section 120 and a respective diverging section 120 of each trace 118 may form an integral continuous wiring element. As shown, the traces 118 extend in an area region of the main surface 112 between pads 124 which are formed as well at the main surface 112 of the component 108. As shown in detail 152, an end portion 158 of the traces 118 may be broadened with respect to the rest of the traces 118 and with respect to the wiring structures of the further redistribution layer 114 to ensure formation of a reliable electric connection be-tween redistribution layers 110, 114.

By the redistribution layers 110, 114 in collaboration, propagation of electric signals between component 108 and stack 102 may be densified. Contrary to conventional approaches, a part of the redistribution functionality of component carrier 100 is outsourced from stack 102 to component 108. By the planar redistribution layer 110 of the embedded component 108, electric signals propagating between stack 102 and component 108 may be routed at die level.

Figures 3, 4, 5, 6, 7:
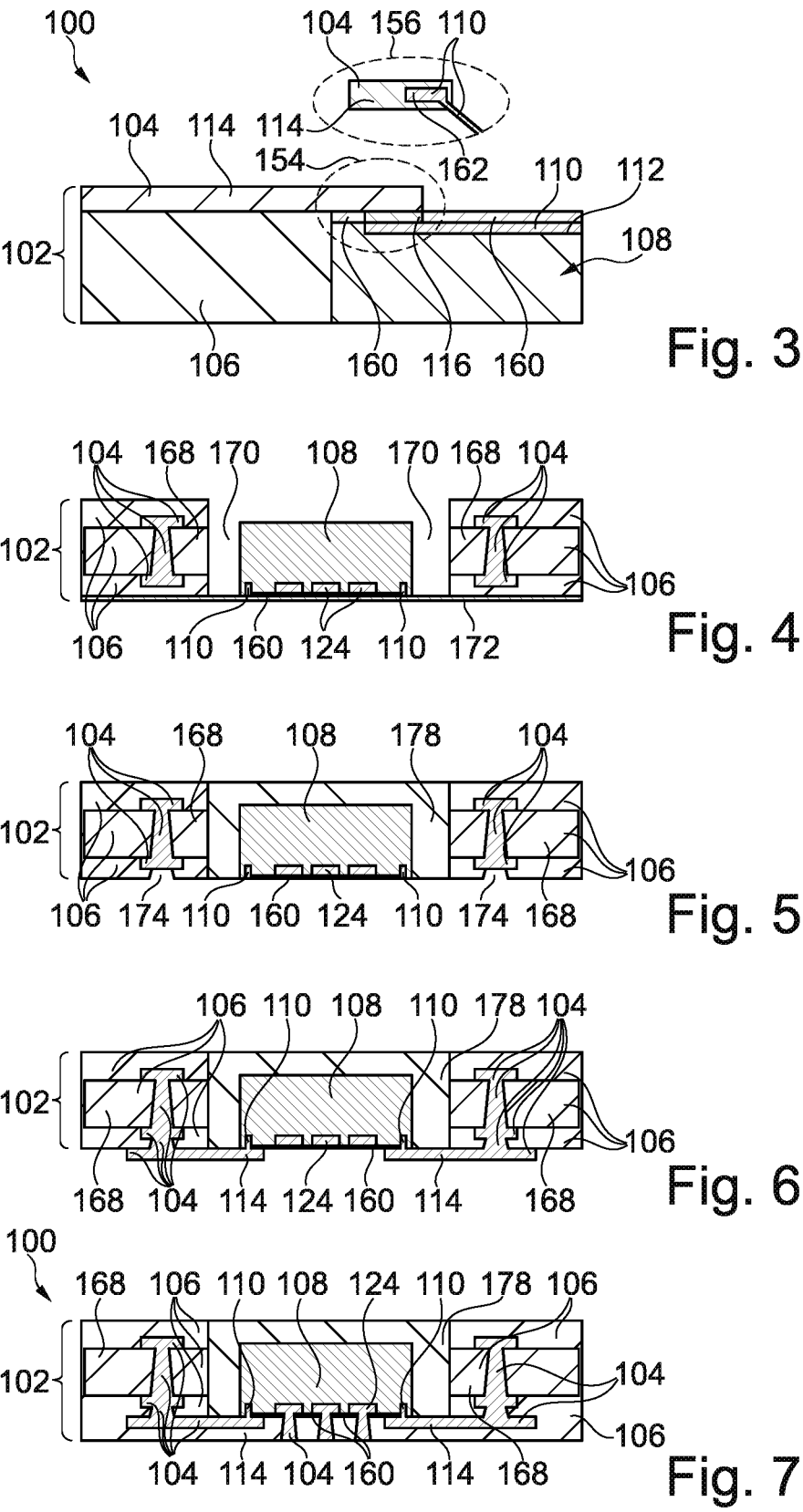
FIG. 3 illustrates a cross-sectional view and a detail of a plan view of a component carrier according to another exemplary embodiment of the invention.
FIG. 4, FIG. 5, FIG. 6, and FIG. 7 illustrate cross-sectional views of structures obtained during carrying out a method of manufacturing a component carrier, shown in FIG. 7, according to an exemplary embodiment of the invention.
Figure 8:
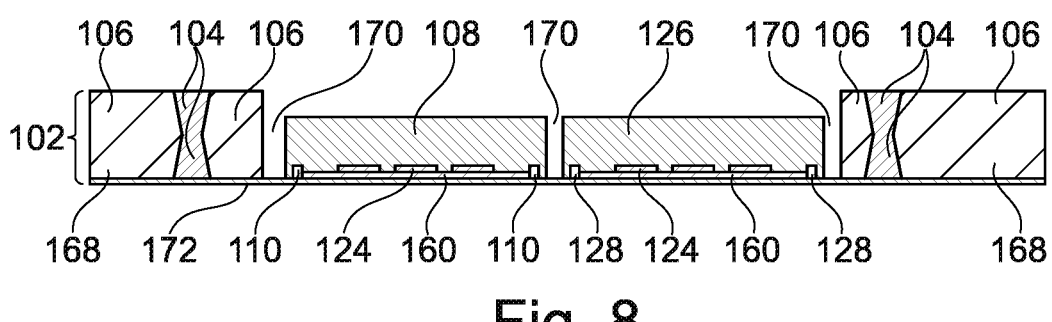
FIG. 8, FIG. 9, FIG. 10, and FIG. 11 illustrate cross-sectional views of structures obtained during carrying out a method of manufacturing a component carrier, shown in FIG. 11, according to another exemplary embodiment of the invention.
Figure 9:
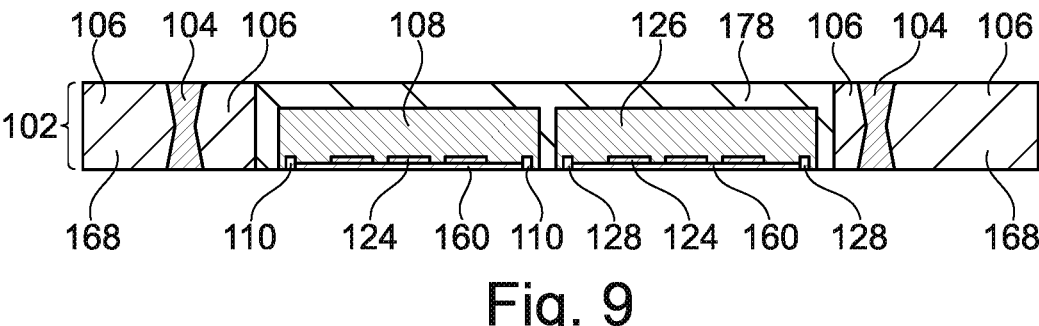
Figure 10:
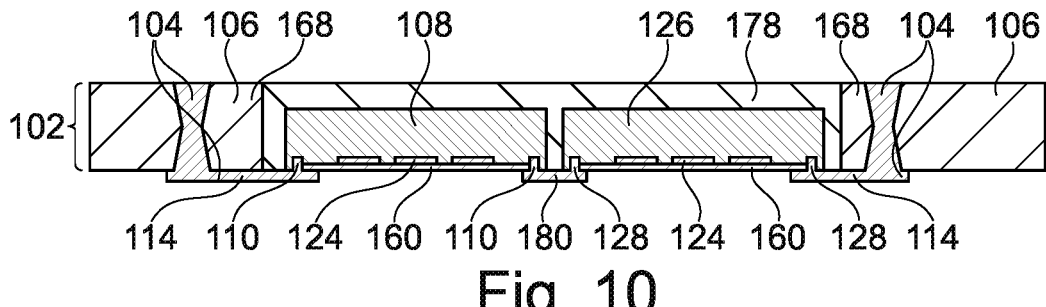

FIG. 3 illustrates a cross-sectional view and a detail 156 of a plan view of a component carrier 100 according to an exemplary embodiment of the invention having a similar architecture as the embodiment of FIG. 1 and FIG. 2.

The embodiment of FIG. 3 differs from the embodiment of FIG. 1 and FIG. 2 in particular in that, according to FIG. 3, a flat connection pad 116 is formed between the redistri-bution layer 110 and the further redistribution layer 114 (see detail 154). Hence, the redistribution layers 110, 114 accord-ing to FIG. 3 are still planar and parallel but show a very small vertical displacement with respect to each other in view of the electrically conductive flat connection pad 116 in between. The flat connection pad 116 may be formed by plating copper into a through hole formed in a passivation layer 160 (which is optional) on the main surface of the component 108. Preferably, passivation layer 160 may be electrically insulating, for instance may be made of a poly-mer or plastic. The small vertical thickness of flat connection pad 116 may be below 50 μm, preferably below 20 μm.

A bottom view according to detail 156 shows that an end portion 162 of the traces 118 may be broadened with respect to the rest of the traces 118. However, in the embodiment of FIG. 3, the broadened end portion 162 may still have a smaller width than the electrically conductive traces of the further redistribution layer 114.

FIG. 4 to FIG. 7 illustrate cross-sectional views of struc-tures obtained during carrying out a method of manufactur-ing a component carrier 100, shown in FIG. 7, according to an exemplary embodiment of the invention. The embedding technology according to a FIG. 4 to FIG. 7 may be denoted as center core embedding of a component 108 in a stack 102 comprising a multi-layer core.

Referring to FIG. 4, stack 102 is used as a starting point which comprises a thick central fully cured core 168. Electrically conductive layer structures 104 are formed on both opposing main surfaces of the core 168 and extend vertically through the core 168. Further electrically insulat-ing layer structures 106 may form upper and lower layers of stack 102.

As shown as well, a through hole 170 may be formed, for instance cut, in stack 102. A temporary carrier 172, for instance a sticky foil, may be attached to the bottom side of the stack 102 so as to close through hole 170 at the bottom side, to thereby obtain a cavity for accommodating compo-nent 108. Thereafter, the component 108 may be placed in the obtained cavity and may be attached to the temporary carrier 172. At the time of assembling the component 108 in the cavity, the component 108 is already equipped at a bottom main surface 112 thereof with a redistribution layer 110 which can be passivated partly by a passivation layer 160. For instance, pads 124 of component 108 may be covered with the passivation layer 160. However, a part of the redistribution layer 110 may be exposed with respect to the passivation layer 160 in order to allow later to create an electrically conductive connection between the redistribu-tion layer 110 of component 108 and a later formed further redistribution layer 114 of stack 102.

In order to obtain the structure shown in FIG. 5, dielectric adhesive or another appropriate filling medium 178 may be filled in the gaps of the cavity between the temporary carrier 172, the stack 102 and component 108 and can be cured (for instance by the application of heat and/or pressure). Thereby, the component 108 is fixed in place in the cavity. Additionally or alternatively to the provision of a liquid filling medium 178 for fixing the component 108 in the cavity, it is also possible to attach an at least partially uncured electrically insulating layer structure (such as a resin sheet or a prepreg sheet) from an upper side and cure the latter by heat and/or pressure so that resin flows into the gaps in the cavity and solidifies by curing.

Thereafter, the temporary carrier 172 may be removed, for instance may be peeled off. Contact holes 174 may then be formed, preferably by laser drilling, in the lowermost elec-trically insulating layer structure 106 of the stack 102 to expose electrically conductive layer structures 104 of stack 102.

Referring to FIG. 6, the contact holes 174 may be filled with electrically conductive material (such as copper) by plating. Furthermore, an electrically conductive layer may be formed at a bottom of the lowermost electrically insu-lating layer structure 106 and the meanwhile filled contact holes 174 and may be patterned for forming further redis-tribution layer 114 as part of the stack 102 and overlapping slightly with the exposed portion of the redistribution layer 110 of component 108 for establishing an electric contact between the redistribution layers 110, 114. By taking this measure, further redistribution layer 114 may also be coupled with other electrically conductive layer structures 104 of the stack 102 in order to guide electric signals between the planar redistribution layers 110, 114 and other vertical levels of stack 102.

In order to obtain component carrier 100 according to the embodiment shown in FIG. 7, one or more further electri-cally insulating layer structures 106 and/or electrically con-ductive layer structures 104 may be formed at a bottom (and/or at a top, not shown) of the structure shown in FIG. 6. In the shown embodiment, a further electrically insulating layer structure 106 is attached to the bottom of the structure shown in FIG. 6. Further laser drilling holes may then be formed and filled with copper by plating. For instance, pads 124 of component 108 may be connected in this way with an electronic periphery of component carrier 100. Moreover, the mentioned copper-filled laser vias connecting the pads 124 on the bottom side may also be a thermal vias contrib-uting to heat removal from embedded component 108, which may generate considerable amount of heat during operation.

Figure 11:
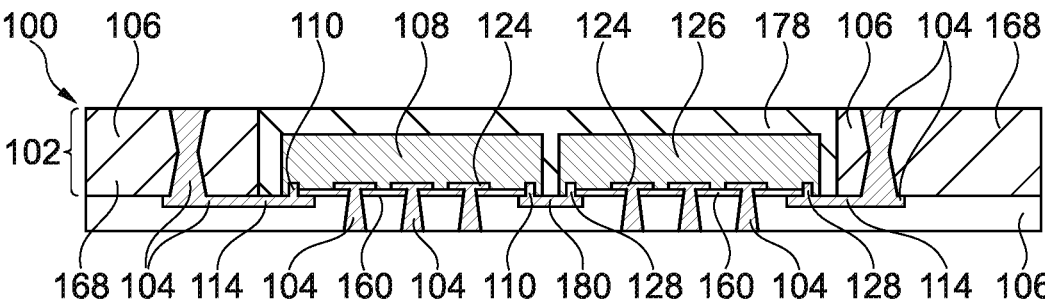
Figure 12:
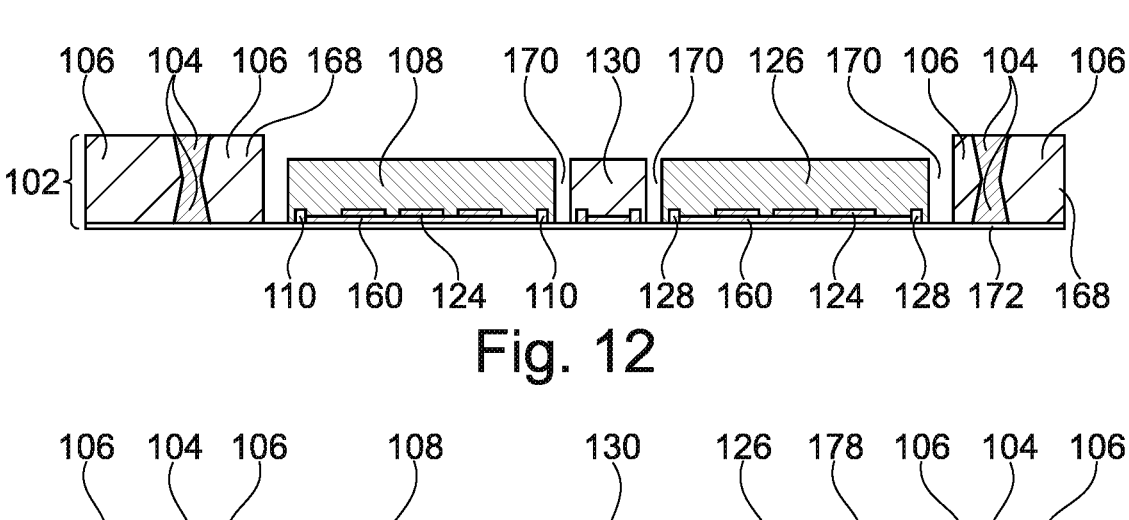
FIG. 12, FIG. 13, FIG. 14, and FIG. 15 illustrate cross-sectional views of structures obtained during carrying out a method of manufacturing a component carrier, shown in FIG. 15, according to still another exemplary embodiment of the invention.
Figure 13:
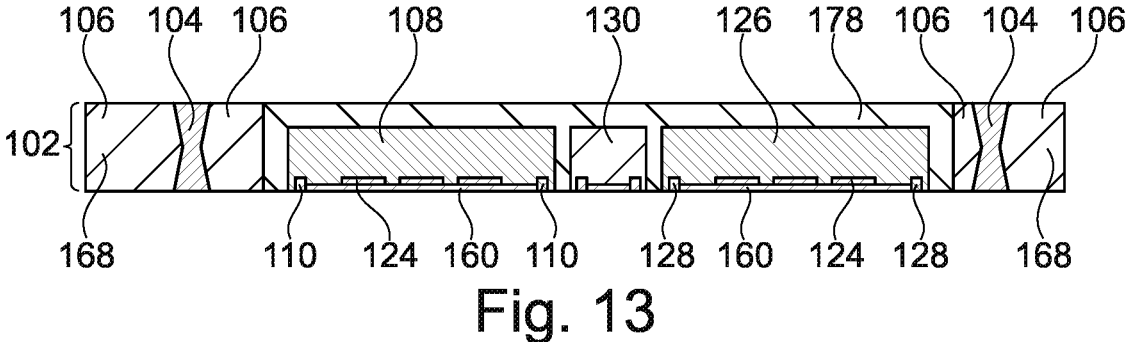
Figure 14:
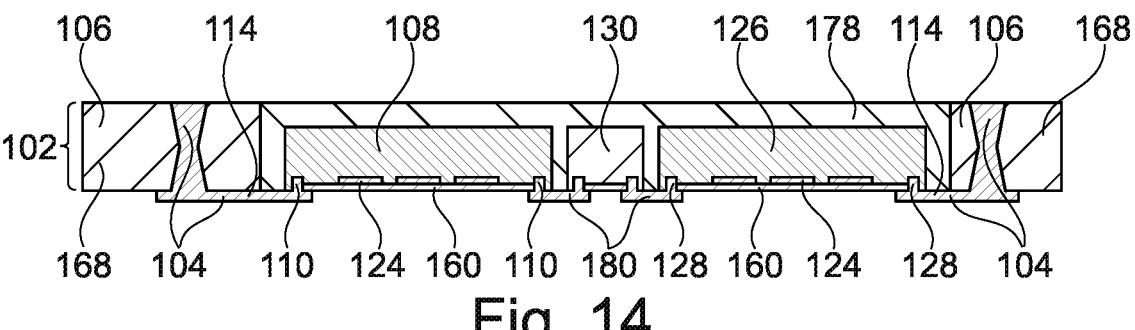

FIG. 8 to FIG. 11 illustrate cross-sectional views of structures obtained during carrying out a method of manu-facturing a component carrier 100, shown in FIG. 11, according to another exemplary embodiment of the inven-tion. The manufacturing architecture according to FIG. 8 to FIG. 11 may be denoted as a center core in padless core approach. A padless technology may be applied in particular to achieve a high-density structure, as—in padless technol-ogy—a pad may be ground before forming the cavity. Then, there may be more space and less limits to arrange the pattern afterwards. Moreover, no alignment may be needed in a padless approach.

The embodiment of FIG. 8 to FIG. 11 is very similar to the embodiment of FIG. 4 to FIG. 7, so that reference is made to the description of FIG. 4 to FIG. 7 also what concerns the process according to FIG. 8 to FIG. 11, wherein the following differences shall be mentioned.

Contrary to the embodiment of FIG. 4 to FIG. 7, the embodiment of FIG. 8 to FIG. 11 places the above-described component 108 and additionally a further embedded component 126 laterally or side-by-side in the same cavity formed in stack 102. The further component 126 has another planar redistribution layer 128 at a bottom main surface thereof, wherein said other planar redistribution layer 128 may be configured as the above-described planar redistribution layer 110 of component 108.

The components 108, 126 may functionally cooperate when operating component carrier 100. For example, component 108 may be a processor chip and component 126 may be a memory chip to which the processor chip may have access. However, many other embodiments are possible for components 108, 126. In order to functionally couple the component 108 and the further component 126 with each other along a horizontal connection line 180, an electric connection may be formed in between. Horizontal connection line 180 may connect the redistribution layers 110, 128 of the co-planar components 108, 126 with a very short electric connection path. Together with corresponding portions of the redistribution layers 110, 128, horizontal connection line 180 forms a U-shaped electric wiring structure in the cross-sectional view of FIG. 10 or FIG. 11. Advantageously, horizontal connection line 180 may be formed simultaneously with the formation of the further redistribution layer 114 of stack 102, i.e., by patterning a common electrically conductive layer formed on a bottom surface of the components 108, 126 and of the stack 102.

With extremely simple means and substantially without additional manufacturing effort, the simultaneous formation of planar redistribution layer 114 of stack 102 and horizontal connection line 180 interconnecting planar redistribution layers 110, 114 can be carried out.

Figure 15:
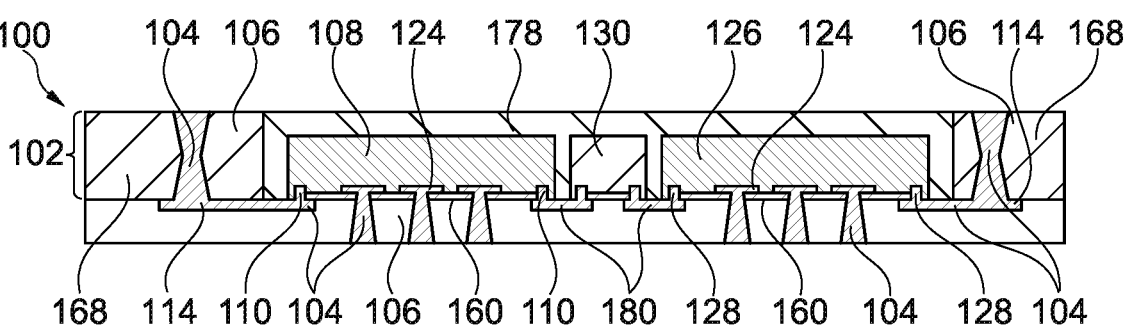

FIG. 12 to FIG. 15 illustrate cross-sectional views of structures obtained during carrying out a method of manufacturing a component carrier 100, shown in FIG. 15, according to still another exemplary embodiment of the invention. FIG. 12 to FIG. 15 may be denoted as a center core in padless core approach with horizontal bridge die 130.

The embodiment of FIG. 12 to FIG. 15 is very similar to the embodiment of FIG. 8 to FIG. 11, so that reference is made to the description of FIG. 8 to FIG. 11 also what concerns the process according to FIG. 12 to FIG. 15, wherein the following difference shall be mentioned.

In the embodiment of FIG. 8 to FIG. 11 and contrary to the embodiment of FIG. 8 to FIG. 11, the component 108 and the further component 126 are electrically coupled with each other by a bridge die 130 arranged between the component 108 and the further component 126. Thus, components 108, 126 and bridge die 130 may be placed side-by-side in the same cavity of stack 112, wherein bridge die 130 is placed in the middle between components 108, 126. Bridge die 130 may be an additional component having internal wiring structures (not shown) for correctly distributing electric signals and electric connections between components 108, 126. As in FIG. 10 and FIG. 11, adjacent components (i.e., component 108 and bridge die 130, as well as component 126 and bridge die 130) may be electrically connected by a respective horizontal connection line 180 which may be formed simultaneously with the formation of planar redistribution layer 114 of stack 102. Hence, the planar wiring architecture of exemplary embodiments of the invention may also be applied in terms of the implementation of a bridge die 130.

Figure 16:
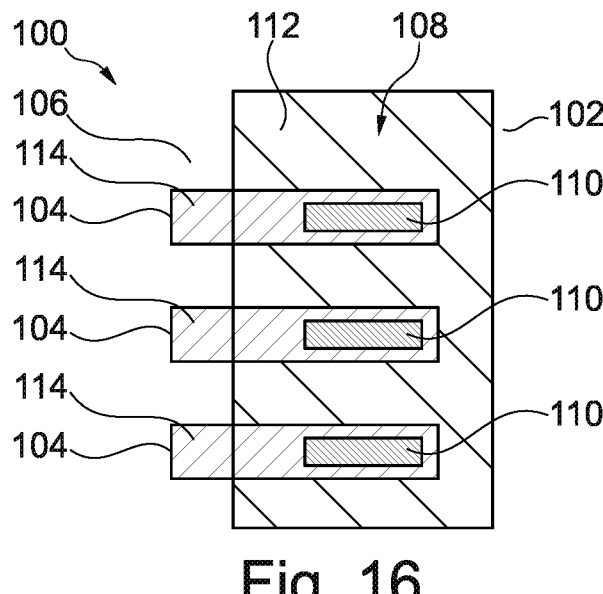
FIG. 16 illustrates a plan view of part of a component carrier according to another exemplary embodiment of the invention.

FIG. 16 illustrates a plan view of a component carrier 100 according to another exemplary embodiment of the invention showing traces on a substrate or stack 102 (see reference sign 114), and a die-type component 108 (which may have a pocket).

Figure 17:
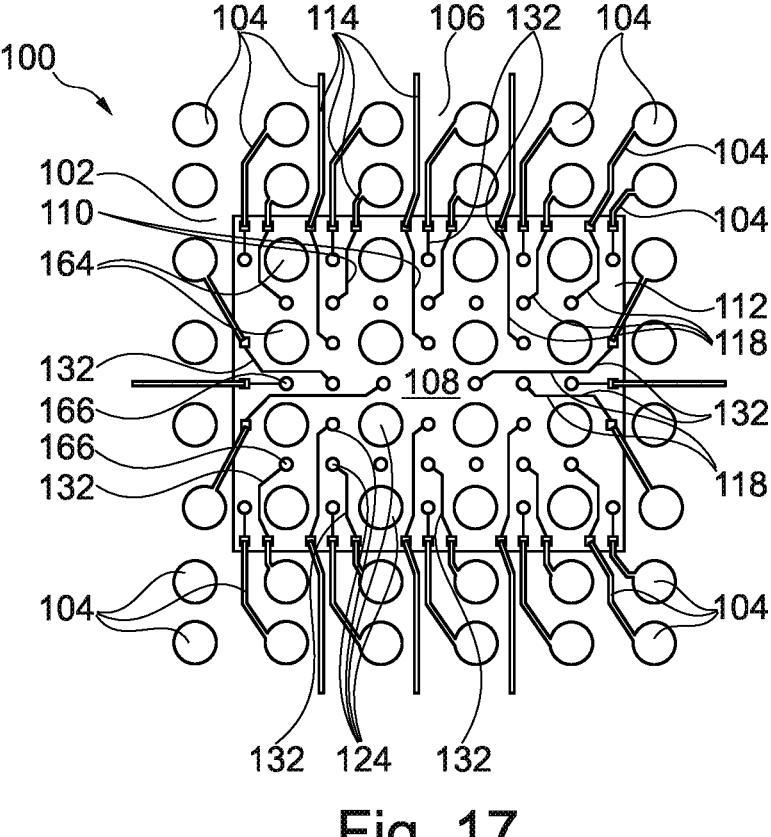
FIG. 17 illustrates a plan view of a component carrier according to still another exemplary embodiment of the invention.

FIG. 17 illustrates a plan view of a component carrier 100 according to still another exemplary embodiment of the invention.

According to FIG. 17, the redistribution layer 110 on a main surface 112 of the embedded component 108 provides electric connections 132 in two orthogonal directions, i.e., both in and horizontal and a vertical direction according to FIG. 17. More specifically, the redistribution layer of the component 108 of FIG. 17 provides electric connections 132 at all four sides of the component 108. As shown, the redistribution layer 110 and the further redistribution layer 114 are electrically coupled with each other—preferably directly—in both orthogonal directions and provide electric connections 132 at said all four sides of the component 108. Hence, the advantage of densification or signal distribution by the component carrier 100 is particularly pronounced in the geometry of FIG. 17.

In the embodiment of FIG. 17, the chip pads 124 comprise first pads 164 and second pads 166 (being smaller than the first pads 164 in the embodiment of FIG. 17). In the shown configuration, the first pads 164 are not connected with the redistribution layers 110, 114. Said first pads 164 may be used for example for accomplishing an electrically conductive connection with the stack 102 at another (in particular at the next) vertical level. In contrast to this, the second pads 166 are connected to the traces 118 of the redistribution layer 110 of the component 108.

Figure 18:
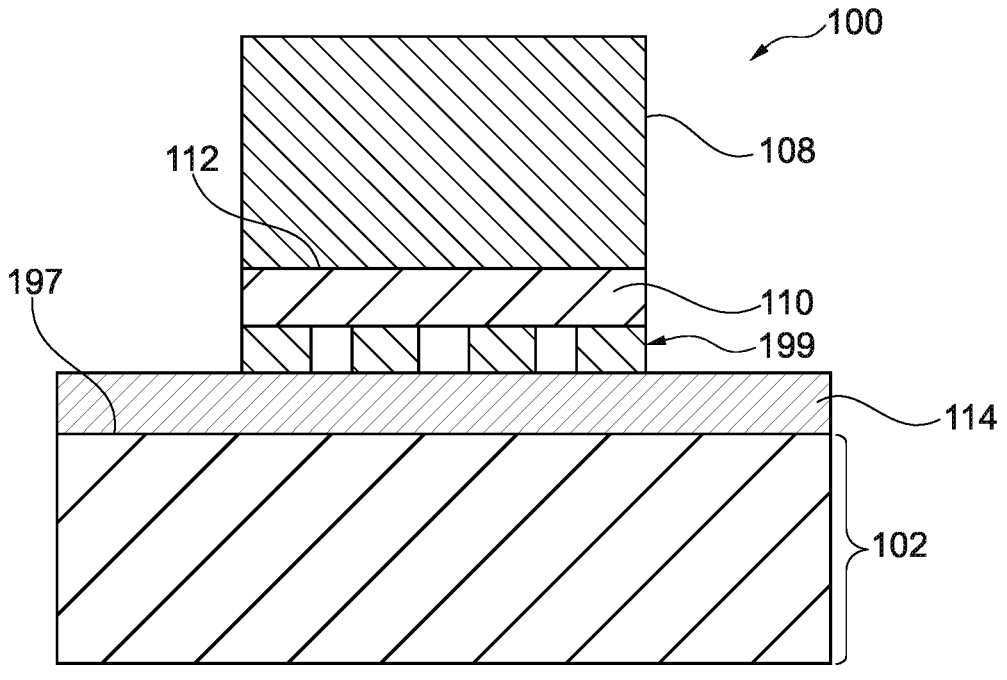
FIG. 18 illustrates a cross-sectional view of a component carrier according to another exemplary embodiment of the invention with a surface mounted architecture.

FIG. 18 illustrates a cross-sectional view of a component carrier 100 according to another exemplary embodiment of the invention.

According to FIG. 18, a component carrier 100 is provided which comprises a laminated layer stack 102, as described above. Furthermore, a component 108 (for example a processor chip) is surface mounted on the stack 102. As shown, the component 108 has a planar redistribution layer 110 at a main surface 112 thereof, which is a lower surface according to FIG. 18. Correspondingly, the stack 102 comprises a further planar redistribution layer 114 at a main surface 197 of the stack 102, which is an upper surface according to FIG. 18. As shown, the redistribution layer 110 and the further redistribution layer 114 are connected with each other electrically and mechanically by an interconnection 199. For example, the interconnection 199 may be a solder structure, a sinter structure, and/or a structure formed by metal bonding (like copper bonding). It is also possible to form an interconnection 199 by thermocompression bonding, hybrid bonding, etc.

Referring to the illustrated embodiment in which the component 108 is mounted on the surface of the stack 102 rather than being embedded therein, the component 108 with its redistribution layer 110 is connected with the further redistribution layer 114 in a surface mounting configuration. The component carrier 100 according to FIG. 18 can be advantageous in particular for a high computing application. In a scenario in which the component 108 has very fine line space and integrated computing functions, the cooperating redistribution layers 110, 114 may have to rearrange and level the signal(s) of the component 108 at its redistribution layer 110. Advantageously, the redistribution layer 110 may be connected with the redistribution layer 114 of the stack 102 of the component carrier 100 which may also have a high density. However, in view of the further redistribution layer 114 on the stack 102, the stack 102 can have a lower integration density. For instance, only the redistribution layer 110 has a high integration density to rearrange the signal(s) of the stack 102 to obtain the connection with component 108. The embodiment of FIG. 18 may have a high yield and may be manufactured in a simple way, since the component 108 may be mounted last.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

The invention claimed is:

1. A component carrier, comprising:
a stack comprising at least one electrically conductive layer structure and at least one electrically insulating layer structure; and
a component connected to the stack;
wherein the component has a planar redistribution layer at a main surface thereof,
wherein the planar redistribution layer comprises a plurality of electrically conductive traces being at least partly linear extending in and along the main surface of the component,
wherein adjacent electrically conductive traces extend partially parallel to each other, and
wherein the electrically conductive traces comprise a diverging section at which the electrically conductive traces diverge from each other such that a mutual distance between the adjacent electrically conductive traces is increasing.

2. The component carrier according to claim 1, wherein the component is embedded in the stack.

3. The component carrier according to claim 1, wherein the planar redistribution layer extends within a horizontal plane.

4. The component carrier according to claim 1, wherein the stack comprises a further planar redistribution layer.

5. The component carrier according to claim 4, wherein the further planar redistribution layer extends within a horizontal plane.

6. The component carrier according to claim 4, wherein the planar redistribution layer and the further planar redistribution layer are electrically coupled with each other.

7. The component carrier according to claim 4, further comprising at least one of the following features:
wherein a main surface of the planar redistribution layer is directly connected with a main surface of the further planar redistribution layer at a common horizontal plane;
wherein a flat connection pad is between the planar redistribution layer and the further planar redistribution layer;
wherein the planar redistribution layer and the further planar redistribution layer are directly connected with each other;
wherein the further planar redistribution layer has a smaller integration density than the planar redistribution layer;

wherein the further planar redistribution layer has a larger line space ratio than the planar redistribution layer.

8. The component carrier according to claim 4, wherein the planar redistribution layer comprises a plurality of linear electrically conductive trace portions, each connecting component contact areas in one extremity, and the further planar redistribution layer comprises further linear electrically conductive trace portions, at least one of said further linear electrically conductive trace portions being electrically connected to an extremity of the at least one linear electrically conductive trace portion, wherein distances between said linear electrically conductive trace portions are smaller than distances between said further electrically conductive linear trace portions.

9. The component carrier according to claim 1, wherein the electrically conductive traces being at least partly linear, comprise a parallel section along which the electrically conductive traces extend parallel to each other.

10. The component carrier according to claim 1, wherein the electrically conductive traces extend in an area of the main surface between pads at the main surface of the component.

11. The component carrier according to claim 1, comprising:
a further component connected to the stack and arranged laterally with respect to the component at the same vertical level.

12. The component carrier according to claim 11, wherein the further component has another planar redistribution layer at a main surface thereof.

13. The component carrier according to claim 11, wherein the component and the further component are electrically coupled with each other along a horizontal connection line.

14. The component carrier according to claim 11, wherein the component and the further component are electrically coupled with each other by a bridge die arranged between the component and the further component.

15. The component carrier according to claim 1, wherein the planar redistribution layer provides electric connections in two orthogonal directions.

16. The component carrier according to claim 15, wherein the stack comprises a further planar redistribution layer, and wherein the planar redistribution layer and the further planar redistribution layer are electrically coupled with each other in the two orthogonal directions.

17. The component carrier according to claim 1, wherein the planar redistribution layer at the main surface of the component is formed by one or more patterned electrically conductive layers.

18. A method of manufacturing a component carrier, comprising:
providing a stack comprising at least one electrically conductive layer structure and at least one electrically insulating layer structure;
connecting a component to the stack; and
providing the component with a planar redistribution layer at a main surface thereof before the connecting,
wherein the planar redistribution layer comprises a plurality of electrically conductive traces being at least partly linear extending in and along the main surface of the component,
wherein adjacent electrically conductive traces extend partially parallel to each other, and
wherein the electrically conductive traces comprise a diverging section at which the electrically conductive traces diverge from each other such that a mutual distance between the adjacent electrically conductive traces is increasing.

19. The method according to claim 18, further comprising:

embedding the component in the stack.

* * * * *